(12) United States Patent
Kutsukake et al.

(10) Patent No.: US 7,583,533 B2
(45) Date of Patent: Sep. 1, 2009

(54) SEMICONDUCTOR DEVICE WITH HIGH-BREAKDOWN-VOLTAGE TRANSISTORS

(75) Inventors: Hiroyuki Kutsukake, Yokohama (JP); Kikuko Ishida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 74 days.

(21) Appl. No.: 11/849,707

(22) Filed: Sep. 4, 2007

(65) Prior Publication Data
US 2008/0055992 A1 Mar. 6, 2008

(30) Foreign Application Priority Data
Sep. 4, 2006 (JP) ............................. 2006-239386

(51) Int. Cl.
*G11C 11/34* (2006.01)
(52) U.S. Cl. ............................. 365/185.17; 365/185.05
(58) Field of Classification Search ............ 365/185.17, 365/185.05, 185.11
See application file for complete search history.

(56) References Cited
U.S. PATENT DOCUMENTS 6,480,419 B2 * 11/2002 Lee ...................... 365/185.18
7,119,413 B2    10/2006 Kutsukake et al.
7,173,861 B2 *  2/2007 Cho et al. .............. 365/185.29
7,233,526 B2 *  6/2007 Umezawa ............... 365/185.27
7,443,728 B2 * 10/2008 Lee et al. ................ 365/185.17

FOREIGN PATENT DOCUMENTS

| JP | 08-306875 | 11/1996 |
|---|---|---|
| JP | 11-251445 | 9/1999 |
| JP | 2000-228509 | 8/2000 |
| JP | 3584866 | 8/2004 |

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor device includes a unit high-breakdown-voltage transistor includes first to fourth high-breakdown-voltage transistors. The first high-breakdown-voltage transistor is connected to a first write line at the other end of the current path thereof, and includes a first gate which is disposed in a first direction. The second high-breakdown-voltage transistor is connected to a second write line at the other end of the current path thereof, and includes a second gate which is disposed in a second direction crossing the first direction. The third high-breakdown-voltage transistor is connected to a third write line at the other end of the current path thereof, and includes a third gate which is disposed in the first direction. The fourth high-breakdown-voltage transistor is connected to a fourth write line at the other end of the current path thereof, and includes a fourth gate which is disposed in the second direction.

20 Claims, 8 Drawing Sheets

Operation voltages (first embodiment)

| | D1 | D2 | D3 | D4 | G1 | G2 | G3 | G4 | Source (S/A) |
|---|---|---|---|---|---|---|---|---|---|
| Write (odd) | 0V or Vdd | Vdd | 0V or Vdd | Vdd | 0V | Vdd | 0V | Vdd | Vdd |
| Write (even) | Vdd | 0V or Vdd | Vdd | 0V or Vdd | Vdd | 0V | Vdd | 0V | Vdd |
| Erase | Vera | Vera | Vera | Vera | Vdd | Vdd | Vdd | Vdd | Vdd |
| Precharge (BL1) | Vdd | 0V | 0V | 0V | Vdd | 0V | 0V | 0V | 0V or Vdd |
| Read (BL1) | 0V or Vdd | 0V | 0V | 0V | Vdd | 0V | 0V | 0V | 0V or Vdd |

Operation voltages (Second embodiment)

| | D1 | D2 | D3 | D4 | G1 | G2 | G3 | G4 | Source (S/A) | Cut-off gates (COG1, COG2) |
|---|---|---|---|---|---|---|---|---|---|---|
| Write (odd) | 0V or Vdd | Vdd | 0V or Vdd | Vdd | 0V | Vdd | 0V | Vdd | Vdd | 0V |
| Write (even) | Vdd | 0V or Vdd | Vdd | 0V or Vdd | Vdd | 0V | Vdd | 0V | Vdd | 0V |
| Erase | Vera | Vera | Vera | Vera | Vdd | Vdd | Vdd | Vdd | Vdd | Vera or FL |
| Precharge (BL1) | Vdd | 0V | 0V | 0V | Vdd | 0V | 0V | 0V | Vdd | 0V |
| Read (BL1) | 0V or Vdd | 0V | 0V | 0V | Vdd | 0V | 0V | 0V | 0V or Vdd | 0V |

F I G. 9

SEMICONDUCTOR DEVICE WITH HIGH-BREAKDOWN-VOLTAGE TRANSISTORS

CROSS-REFERENCE TO RELATED APPLICATIONS

This application is based upon and claims the benefit of priority from prior Japanese Patent Application No. 2006-239386, filed Sep. 4, 2006, the entire contents of which are incorporated herein by reference.

BACKGROUND OF THE INVENTION

1. Field of the Invention

The present invention relates to a semiconductor device, and is applied to, for example, a high-breakdown-voltage transistor which is disposed in a peripheral circuit of a NAND flash memory.

2. Description of the Related Art

Conventionally, a high-breakdown-voltage transistor is disposed between a sense amplifier of a NAND flash memory and a bit line. For example, when the potential of a bit line is raised to an erase voltage Vera that is a high voltage (e.g. about 20V) at a time of a data erase operation of a memory cell, the high-breakdown-voltage transistor is used to cut off a path between the sense amplifier and the bit line (see, e.g. Jpn. Pat. Appln. KOKAI Publication No. 2002-76354, corresponding to no USP).

In the prior art, however, two high-breakdown-voltage transistors having sources commonly connected to two bit lines (e.g. odd/even bit lines) are composed as a single unit. As a result, the area of occupation of the high-breakdown-voltage transistors increases, and this is disadvantageous for microfabrication.

Further, at the time of a write operation of a memory cell, it is necessary to control two gate potentials of the high-breakdown-voltage transistors, and to transfer odd/even bit line potentials to the sense amplifier. However, since there is the need to apply the above-mentioned high voltage, the area of occupation of the high-breakdown-voltage transistors has to be increased, compared to a memory cell, etc., from the standpoint of gate insulation breakdown. If the degree of microfabrication of memory cells increases, the number of bit lines, which need to be gathered, also increases, and the area of occupation of the high-breakdown-voltage transistors, relative to the area of occupation of memory cells, increases. Consequently, the reduction in size of the semiconductor chip is hindered. As described above, the increase in area of occupation of the high-breakdown-voltage transistor has a great influence on the microfabrication of the entire semiconductor device.

BRIEF SUMMARY OF THE INVENTION

According to an aspect of the present invention, there is provided a semiconductor device comprising a unit high-breakdown-voltage transistor including first to fourth high-breakdown-voltage transistors which are commonly connected at one end of each of current paths thereof, wherein the first high-breakdown-voltage transistor is connected to a first write line at the other end of the current path thereof, and includes a first gate which is disposed in a first direction; the second high-breakdown-voltage transistor is connected to a second write line at the other end of the current path thereof, and includes a second gate which is disposed in a second direction crossing the first direction; the third high-breakdown-voltage transistor is connected to a third write line at the other end of the current path thereof, and includes a third gate which is disposed in the first direction; and the fourth high-breakdown-voltage transistor is connected to a fourth write line at the other end of the current path thereof, and includes a fourth gate which is disposed in the second direction.

BRIEF DESCRIPTION OF THE SEVERAL VIEWS OF THE DRAWING

FIG. 9 shows operation voltages of the cut-off circuit according to the second embodiment.

DETAILED DESCRIPTION OF THE INVENTION

Figure 1:
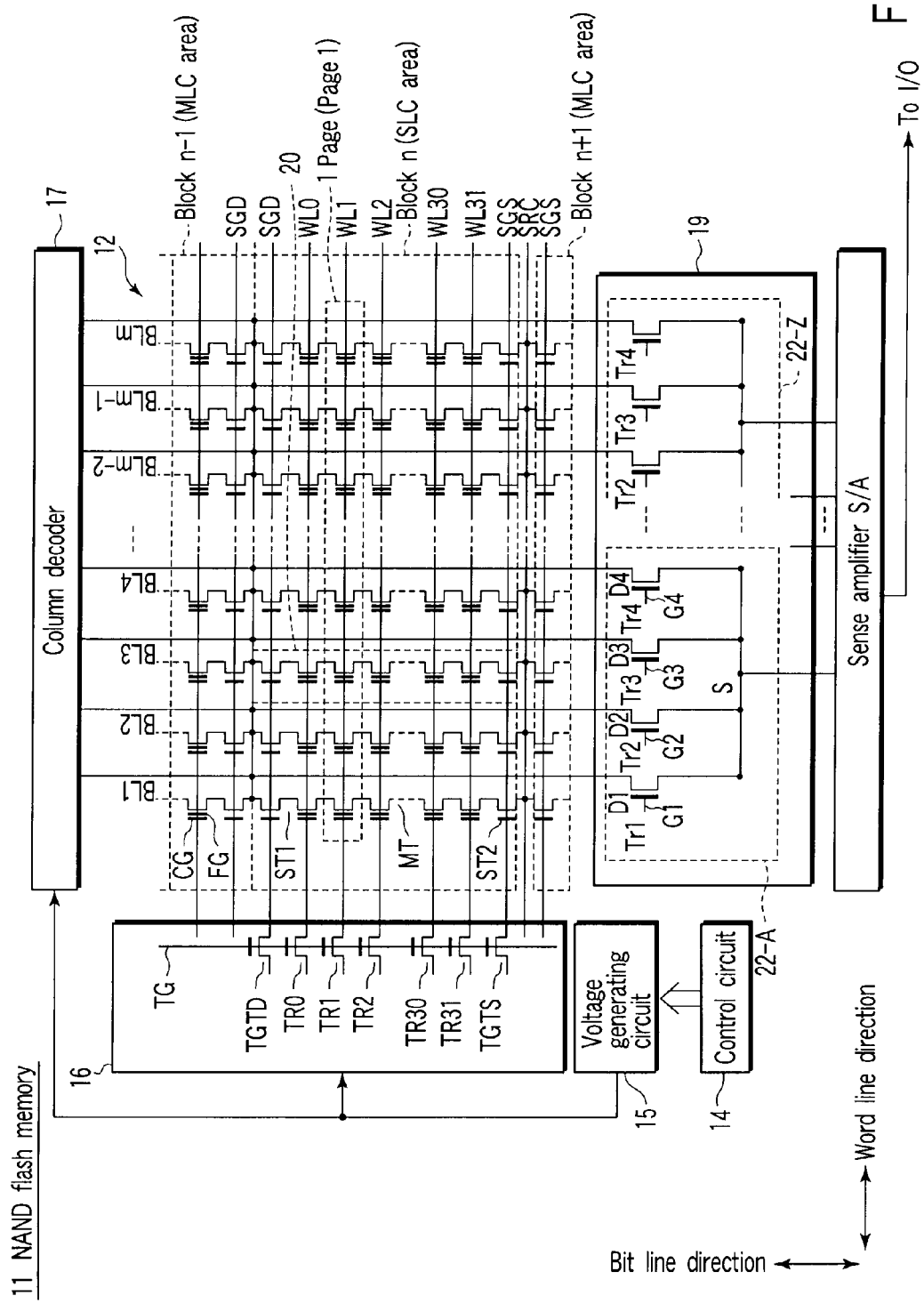
FIG. 1 is a circuit diagram of a semiconductor device according to a first embodiment of the present invention.

Embodiments of the present invention will now be described with reference to the accompanying drawings. In the description below, common parts are denoted by like reference numerals throughout the drawings.

FIRST EMBODIMENT

An Example of a Unit High-Breakdown-Voltage Transistor Having a Cross-Shaped Active Region To begin with, referring to FIG. 1 to FIG. 4, a semiconductor memory device according to a first embodiment of the present invention is described. FIG. 1 is a circuit diagram showing the semiconductor memory device according to this embodiment. In this embodiment, a NAND flash memory is described as an example of the semiconductor memory device.

As shown in FIG. 1, a NAND flash memory 11 includes a memory cell array 12, a control circuit 14, a voltage generating circuit 15, a row decoder 16, a column decoder 17, a cut-off circuit 19 and a sense amplifier S/A.

The voltage generating circuit 15 is configured to generate voltages of predetermined values, for example, a write voltage Vpgm, an erase voltage Vera and a read voltage Vread.

The control circuit 14 is configured to control the voltage generating circuit 15.

The memory cell array 12 is composed of a plurality of blocks (Block n−1, Block n, Block n+1, . . . ; n is a natural number). For example, the block (Block n) is a single-level NAND flash memory which is configured as an SLC (Single Level Cell) area which is capable of recording 1-bit data in one memory cell transistor MT.

The block (Block n) includes a plurality of memory cell transistors MT which are arranged in a matrix at intersections between, e.g. 32 word lines WL0 to WL31 and an m-number of bit lines BL1 to BLm (m≧4k: k is a natural number of 1 or more).

Each of the memory cell transistors MT has a stacked structure comprising a tunnel insulation film provided on a semiconductor substrate (e.g. a silicon substrate); a floating electrode FG provided on the tunnel insulation film; an inter-gate insulation film provided on the floating electrode FG; and a control electrode CG provided on the inter-gate insulation film. Memory cell transistors MT, which neighbor in the direction of the bit line BL, have their sources/drains shared as their current paths. The current paths are connected in series at one end and the other end. In this example, 32 memory cell transistors are connected in series.

A NAND cell column 20 is constituted by the memory cell transistors MT, which have their current paths connected in series at one end and the other end, and select transistors ST1 and ST2. The NAND cell column 20 is selected by the select transistors ST1 and ST2. One end of the current path of the NAND cell column 20 is connected to the sense amplifier S/A via the cut-off circuit 19, and the other end of the current path is connected to a source line SRC.

The number of memory cell transistors MT is not limited to 32, and may be 8 or 16, for instance. In addition, only one of the select transistors ST1 and ST2 may be provided if the select transistor is configured to be able to select the NAND cell column 20.

The control electrodes CG of the memory cell transistors MT in the direction of the word line WL are commonly connected to an associated one of the word lines WL0 to WL31. The gates of the select transistors ST1 are commonly connected to a select gate SGD, and the gates of the select transistors ST2 are commonly connected to a select gate SGS. The drain of the select transistor ST1 is connected to one of the bit lines BL0 to BLm+1, and the source of the select transistor ST2 is connected to a source line SRC.

As indicated by a broken-line box, one page (PAGE) is provided in the direction of the word line WL in association with each of the word lines WL0 to WL31. For example, a page (PAGE1) is present in association with the word line WL1. One page comprises a data area (e.g. about 512 Bytes) that stores, data, etc., and a redundant area (e.g. about 16 Bytes). The redundant area includes an ECC (Error Correcting Code) area (e.g. about 3 Bytes).

Since data write and data read are executed in units of a page, the page is a unit of data write/read. An erase operation is performed batchwise in units of the block (Block n) by applying the erase voltage Vera to all the control electrodes CG and releasing electrons in the floating gates FG.

For example, another block (Block n−1, Block n+1) is a multilevel NAND flash memory which is configured as an MLC (Multi Level Cell) area that is capable of recording multi-bit data in one memory cell transistor MT. In the other structural aspects, the block (Block n−1, Block n+1) is the same as the block (Block n). In principle, each of the blocks (Block) is configured as one of the SLC area or the MLC area, but the SLC area and MLC area may be present in a hybrid fashion, depending on cases.

The row decoder 16 is configured to select word lines WL0 to WL31 and select gate lines SGD and SGS in accordance with addresses which are designated from a memory controller (not shown). The row decoder 16 includes transfer gate transistors TGTD and TGTS and transfer transistors TR0 to TR31, which have gates commonly connected to a transfer gate line TG. The transfer transistors TR0 to TR31 apply predetermined voltages, such as an erase voltage Vera and a write voltage Vpgm, to the control electrodes CG of the memory cell transistors MT.

The sense amplifier S/A is configured to amplify data of each page which is read out of the bit lines BL0 to BLm. For example, the sense amplifier S/A is composed of a plurality of latch circuits, which have inputs connected to the bit lines BL0 to BLm and outputs connected to an output terminal (I/O).

The cut-off circuit 19 is disposed on a current path between the memory cell array 12 and the sense amplifier S/A, and includes a plurality of unit high-breakdown-voltage transistors 22-A to 22-Z.

For example, the unit high-breakdown-voltage transistor 22-A includes four high-breakdown-voltage transistors Tr1 to Tr4. The sources S of the high-breakdown-voltage transistors Tr1 to Tr4 are commonly connected to the input of the sense amplifier S/A. The drains D1 to D4 of the high-breakdown-voltage transistors Tr1 to Tr4 are connected to the sequentially aligned bit lines BL1 to BL4, respectively, and the gates G1 to G4 of the high-breakdown-voltage transistors Tr1 to Tr4 are independently controlled. The other unit high-breakdown-voltage transistors 22B to 22-Z have the same structure as the unit high-breakdown-voltage transistor 22-A.

Next, the plan-view layout and the cross-sectional structure of the cut-off circuit 19 are described in greater detail with reference to FIG. 2 to FIG. 4.

Figure 2:
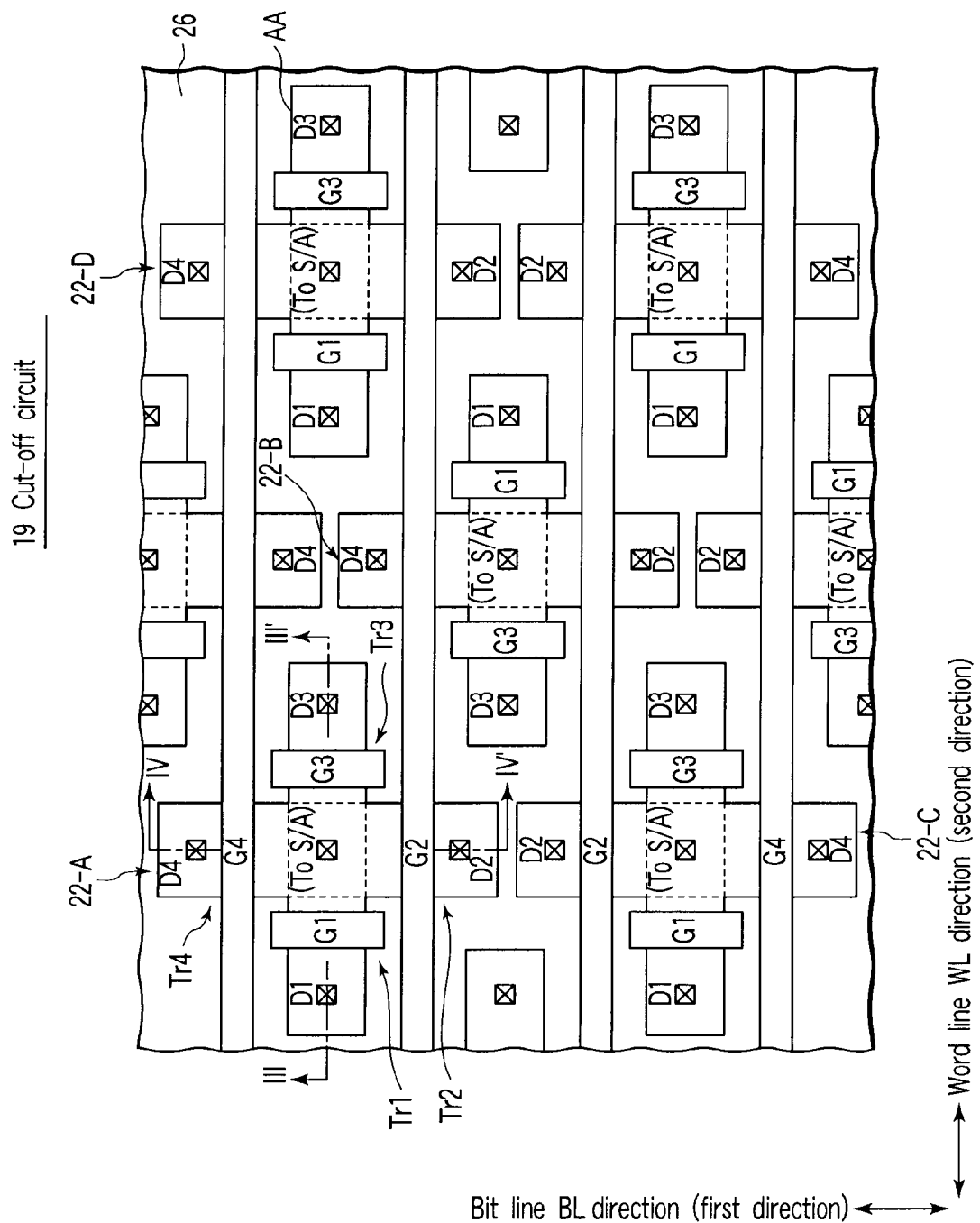
FIG. 2 is a plan view showing a layout of a cut-off circuit according to the first embodiment.

As is shown in FIG. 2, the plan-view layout of an active area AA of each of the unit high-breakdown-voltage transistors 22A to 22-Z has a cross shape in which a source S is disposed at the center, the drains D1 and D3 extend in a bit line direction (first direction) and the drains D2 and D4 extend along a word line direction (second direction). The active area AA is an impurity-diffused layer which is electrically isolated by a device isolation film 26 that is buried in a semiconductor substrate 21, functions as a source S and drains D1 to D4, and is provided in the substrate 21. For example, the active area AA is formed by doping phosphorus (P) or arsenic (As) in the substrate 21 by using the gates G1 to G4 as a mask.

The gates G1 to G4 are disposed between the sources S and the drains D1 to D4, to form the high-breakdown-voltage transistors Tr1 to Tr4, respectively.

In each of the unit high-breakdown-voltage transistors 22-A to 22-Z, four bit lines are gathered in each unit high-breakdown-voltage transistor and the sources of the high-breakdown-voltage transistors of each unit high-breakdown-voltage transistor are commonly integrated. For example, the unit high-breakdown-voltage transistor 22-A includes a set of bit lines BL1 to BL4, and the sources of the high-breakdown-voltage transistors of the unit high-breakdown-voltage transistor 22-A are commonly integrated. The plural unit high-breakdown-voltage transistors 22-A to 22-Z are arranged in a staggered fashion with a displacement of about ½ pitch in the word line WL direction (second direction).

Further, the gate electrodes of the high-breakdown-voltage transistors of a certain unit high-breakdown-voltage transistor are arranged commonly with the gate electrodes of the high-breakdown-voltage transistors of other unit high-breakdown-voltage transistors which neighbor in the bit line BL direction and word line WL direction. For example, the gate electrodes G1 and G3 of the high-breakdown-voltage transistors Tr1 and Tr3 are arranged commonly with the gate electrodes G1 and G3 of the high-breakdown-voltage transistors of the neighboring unit high-breakdown-voltage transistor 22-C in the bit line BL direction via an overlying wiring layer (not shown). For example, the gate electrodes G2 and G4 of the high-breakdown-voltage transistors Tr2 and Tr4 are arranged commonly with the gate electrodes of the neighboring high-breakdown-voltage transistors of the neighboring unit high-breakdown-voltage transistor 22-D in the word line WL.

Figure 3:
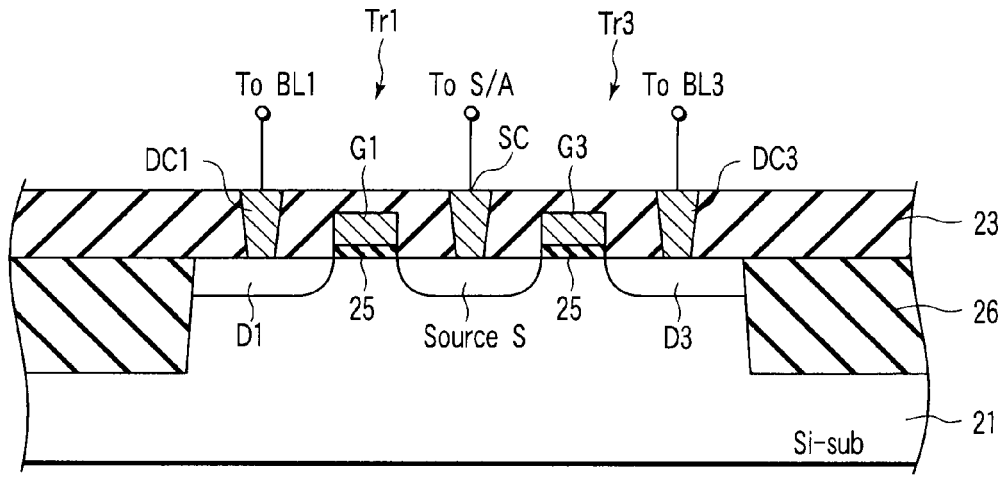
FIG. 3 is a cross-sectional view taken along line III-III' in FIG. 2.

As shown in FIG. 3, the high-breakdown-voltage transistor Tr1 includes a gate insulation film 25 which is provided on a semiconductor substrate (silicon (Si) substrate) 21; a gate electrode G1 which is provided on the gate insulation film 25 in the bit line BL direction (first direction); and a source S and a drain D1 which are provided in the word line WL direction (second direction) and are spaced apart in the substrate 21 so as to sandwich the gate electrode G1. A source line contact SC is provided in an interlayer insulation film 23 on the source S. The source S is electrically connected to the sense amplifier S/A via the source line contact SC. The drain D1 is electrically connected to the bit line BL1 via a drain contact DC1.

The high-breakdown-voltage transistor Tr3 includes a gate insulation film 25 which is provided on the semiconductor substrate 21; a gate electrode G3 which is provided on the gate insulation film 25 in the bit line BL direction; and a source S and a drain D3 which are provided in the word line WL direction and are spaced apart in the substrate 21 so as to sandwich the gate electrode G3. The drain D3 is electrically connected to the bit line BL3 via a drain contact DC3.

Figure 4:
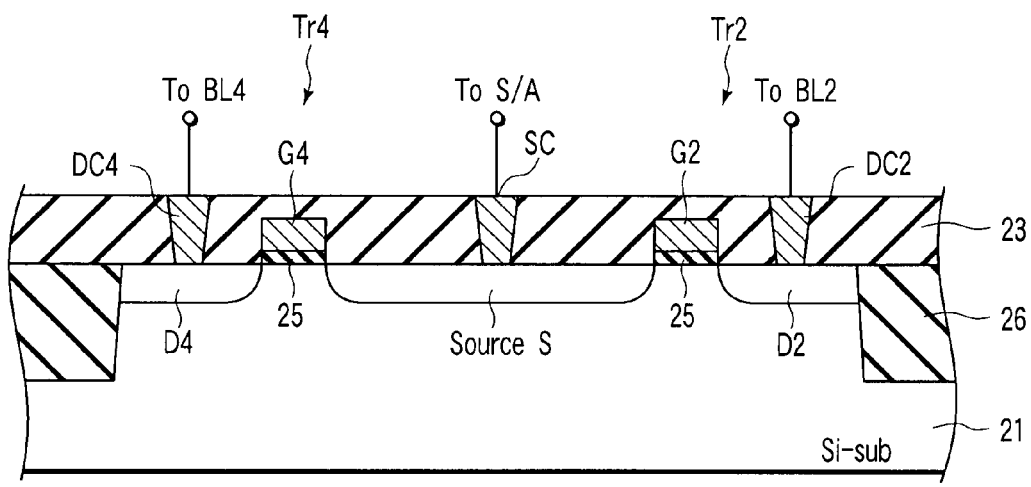
FIG. 4 is a cross-sectional view taken along line IV-IV' in FIG. 2.

As shown in FIG. 4, the high-breakdown-voltage transistor Tr2 includes a gate insulation film 25 which is provided on the semiconductor substrate 21; a gate electrode G2 which is provided on the gate insulation film 25 in the word line WL direction; and a source S and a drain D2 which are provided in the bit line BL direction and are spaced apart in the substrate 21 so as to sandwich the gate electrode G2. The drain D2 is electrically connected to the bit line BL2 via a drain contact DC2.

The high-breakdown-voltage transistor Tr4 includes a gate insulation film 25 which is provided on the semiconductor substrate 21; a gate electrode G4 which is provided on the gate insulation film 25 in the word line WL direction; and a source S and a drain D4 which are provided in the bit line BL direction and are spaced apart in the substrate 21 so as to sandwich the gate electrode G4. The drain D4 is electrically connected to the bit line BL4 via a drain contact DC4.

<Relationship in Bias>

Figures 5, 6:
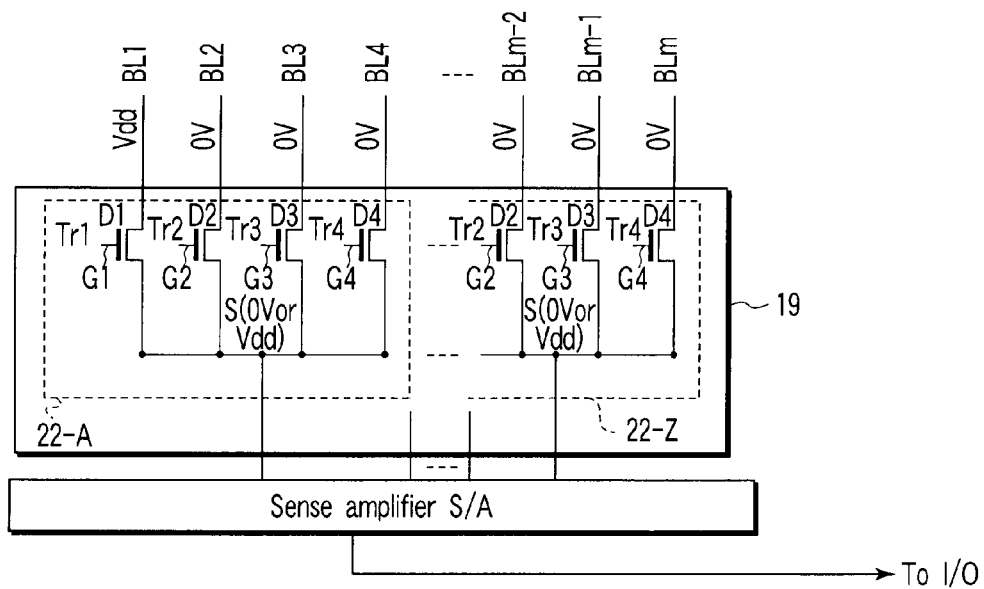
FIG. 5 shows operation voltages of the cut-off circuit according to the first embodiment.
FIG. 6 is a circuit diagram illustrating an odd-numbered bit line write operation of the cut-off circuit according to the first embodiment.
Figure 7:
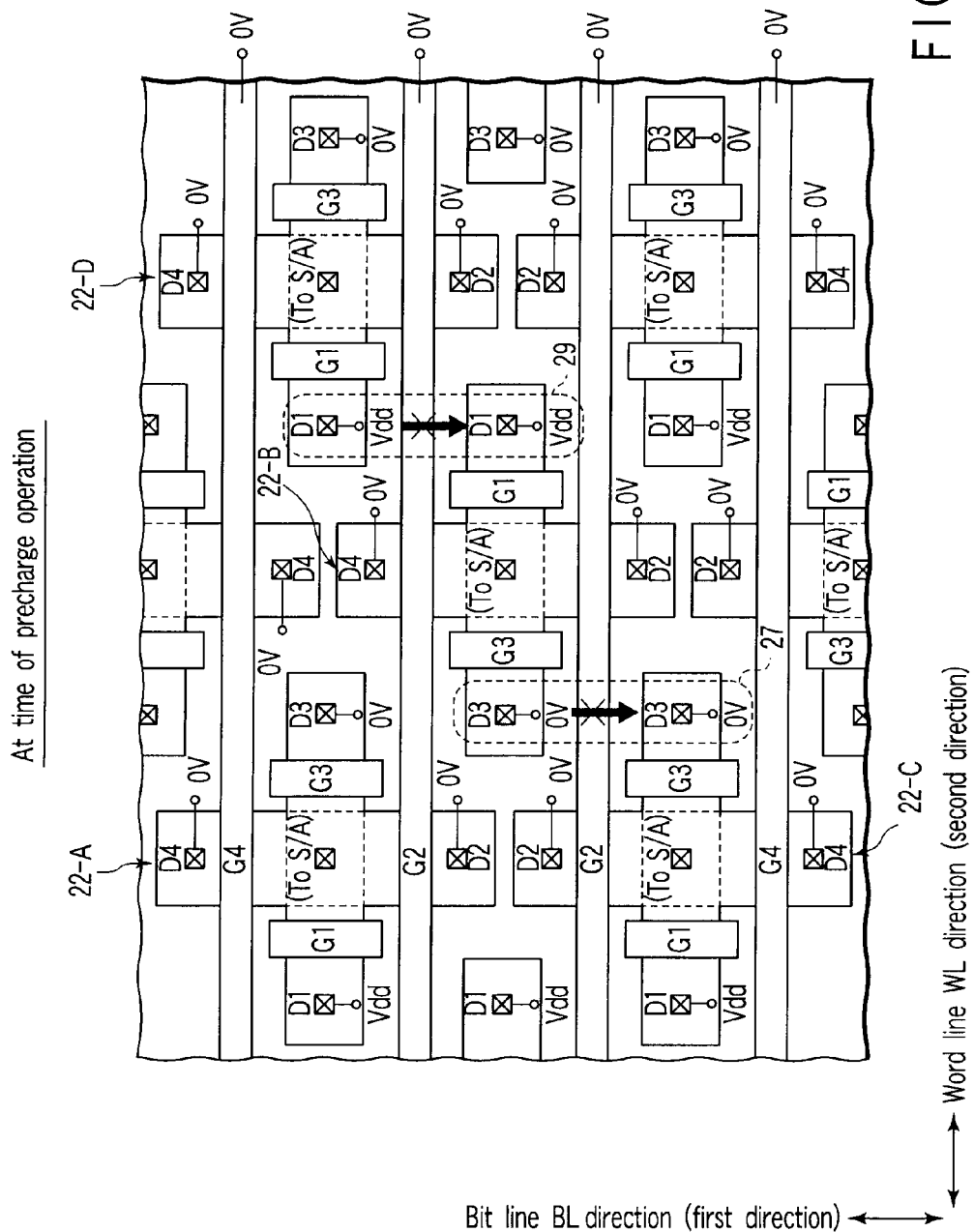
FIG. 7 is a plan view showing a layout at a time of odd-numbered bit line write of the cut-off circuit according to the first embodiment.

Next, referring to FIG. 5 to FIG. 7, a description is given of the relationship in bias in the cut-off circuit 19 at the time of a write operation, an erase operation and a read operation in the semiconductor device according to the present embodiment. The description is based on FIG. 5.

(Write (Odd) operation)

To begin with, the relationship in bias at the time of odd-write is described. This operation is executed by injecting, in units of a NAND, for example, cell column 20, electrons into the floating electrodes FG of the memory cell transistors MT which are connected to an odd-numbered bit line BL.

In other words, this is a case where a voltage of 0V (if data is written in the memory cell transistor MT) or a power supply voltage Vdd (if data is not written in the memory cell transistor MT) is applied to the odd-numbered bit lines BL1, BL3, . . . , BLm−1, and a power supply voltage Vdd is applied to the even-numbered bit lines BL2, BL4, . . . , BLm−2, BLm.

As shown in FIG. 5, a power supply voltage Vdd is applied to THE source S that is connected to the sense amplifier S/A.

Subsequently, 0V or a predetermined voltage (Vdd+threshold voltages of Tr. 1 and Tr. 3) is applied to the odd-numbered gates G1 and G3, and a predetermined voltage (Vdd+threshold voltages of Tr. 2 and Tr. 4) is applied to the even-numbered gates G2 and G4. If 0V is applied to the odd-numbered gates G1 and G3, Tr. 1 and Tr. 3 are turned off but a transistor (not shown) having one end connected to D1 and another end at GND potential is turned on, and 0V is thereby applied to D1 and D3.

As a result, 0V or a power supply voltage Vdd is transferred to odd-numbered drains D1 and D3 that are connected to the odd-numbered bit lines BL, and a power supply voltage Vdd is transferred to the even-numbered drains D2 and D4 that are connected to the even-numbered bit lines BL.

Thus, 0V or a power supply voltage Vdd is applied to the odd-numbered bit lines BL1, BL 3, . . . , and BLm−1 that are connected to the odd-numbered drains D1 and D3, and a power supply voltage Vdd is applied to the even-numbered bit lines BL2, BL4, . . . , BLm−2, and BLm.

At this time, the voltage that is applied between the neighboring unit high-breakdown-voltage transistors is a potential difference (e.g. about 3V) of about 0V to Vdd at maximum. Therefore, the field width (i.e. the width of the device isolation film 26) can be decreased to such a size as to be capable of preventing a punch-through breakdown voltage at the potential difference of about 0V to Vdd.

(Write (Even) Operation)

As shown in FIG. 5, the relationship in bias between the voltages applied to the odd-numbered gates G1 and G3 and the voltages applied to the even-numbered gates G2 and G4 is reversed between the even write operation and the odd write operation.

(Erase Operation)

Next, the relationship in bias at the time of an erase operation is described. This operation is executed by discharging the electrons, which are injected in the floating gates FG of the memory cell transistors MT in the write operation, into the substrate 21 in a batchwise manner in units of the block (Block).

To start with, as shown in FIG. 5, the erase voltage Vera (e.g. about 20V) is applied to all the bit lines BL1, . . . , BLm, and the erase voltage Vera is also applied to the drains D1 to D4. At this time, simultaneously, a power supply voltage Vdd is applied to the gates G1 to G4 and a power supply voltage Vdd is also applied to the source S that is connected to the sense amplifier S/A.

As described above, even at the time of the erase operation, the same erase voltage Vera is applied to the odd-numbered drains D1 and D3 which are provided so as to sandwich the even-numbered gates G2 and G4, and no potential difference occurs in the diffusion layers. Thus, a field inversion leak current is prevented between the drains D1 and D3 of unit high-breakdown-voltage transistors 22 which neighbor with a displacement of about a ½ pitch in the first direction.

(Precharge Operation)

Next, the relationship in bias at the time of a precharge operation is described. The precharge operation is an operation for charging the read-out bit line BL prior to the read operation. In this description, the case of precharging the bit line BL1 (drains D1 of unit high-breakdown-voltage transistors 22) is described by way of example.

To start with, as shown in FIG. 5 and FIG. 6, in order to charge the selected bit line BL1 at the power supply voltage Vdd, the power supply voltage Vdd is applied to the sources S that are connected to the sense amplifier S/A.

Then, a predetermined voltage (Vdd+threshold voltage of Tr1) is applied to the gate G1, and 0V is applied to the gates G2 to G4. As a result, a power supply voltage Vdd is applied to the drain D1, and a power supply voltage Vdd is transferred to the selected bit line BL that is connected to the drain D1. On the other hand, since the drains D2 to D4 are cut off, the non-selected bit lines BL2 to BL4 that are connected to the drains D2 to D4 are also cut off.

Thus, the voltages at the drains D1 to D4 can be transferred to the bit lines BL1 to BLm and thereby the selected bit line BL1 is precharged.

FIG. 7 shows the relationship in bias at the time of the precharge operation. For example, as indicated by a broken line 29 in FIG. 7, the power supply voltage Vdd is applied to the drains D1 of the unit high-breakdown-voltage transistors 22-B and 22-D, and 0V is applied to the gate electrode G2 that is provided between the devices. Thus, a potential difference is prevented from occurring between the diffusion layers of the respective drains D1 in the first direction, and no leak current flows. Therefore, a field inversion leak current is prevented.

Moreover, as indicated by a broken line 27 in FIG. 7, 0V is applied to the drains D3 of the unit high-breakdown-voltage transistors 22-B and 22-C, and to the gate electrode G2 that is provided between the devices. Thus, a potential difference is prevented from occurring between the diffusion layers of the respective drains D3 in the first direction, and no leak current flows. Therefore, a field inversion leak current is prevented.

At this time, the read voltage Vread is applied to the selected word line and non-selected word lines, and all memory cell transistors are turned on.

(Read Operation)

Next, the relationship in bias at the time of the read operation is described. This operation is executed by rendering the memory cell transistors MT, which are connected to the precharged bit line BL, electrically conductive to the sense amplifier S/A in units of the NAND cell column 20, and amplifying the data that is stored in the memory cell transistors MT. In this description, the case of reading out data of memory cell transistors MT connected to the bit line BL1 is described by way of example.

To start with, following the precharge operation, 0V is applied to the selected word line, and the read voltage Vread is applied to the non-selected word line.

At this time, a predetermined voltage (Vdd+threshold voltage of Tr1) is applied to the gate G1, and the high-breakdown-voltage transistor Tr1 is turned on. As a result, the drain D1 is electrically conductive to the sense amplifier S/A. On the other hand, 0V is applied to the other gates G2 to G4, and the high-breakdown-voltage transistors Tr2 to Tr4 are turned off.

Thus, a sense node that is stored in a capacity in the sense amplifier S/A is changed by 0V or the power supply voltage Vdd, which is a data voltage from the bit line BL1, at the source S that is connected to the sense amplifier S/A. As a result, the data on the bit line BL1 is read out.

As has been described above, according to the semiconductor device of this embodiment, at least the following advantageous effects (1) to (3) can be obtained.

(1) Microfabrication can advantageously be achieved.

As has been described above, the plan-view layout of the active area AA of each of the unit high-breakdown-voltage transistors 22A to 22-Z has the cross shape in which the source S is disposed at the center, the drains D1 and D3 extend in the bit line direction (first direction) and the drains D2 and D4 extend along the word line direction (second direction). Thus, the unit high-breakdown-voltage transistors (e.g. 22-A and 22-D) are displaced by about a ½ pitch in the word line direction, and parts of the unit high-breakdown-voltage transistors (e.g. 22-B), which are displaced by about ½ pitch in the bit line direction, are disposed between the displaced unit high-breakdown-voltage transistors (e.g. 22-A and 22-D). Thereby, the unit high-breakdown-voltage transistors can be arranged in a staggered fashion with a highest-density structure.

In addition, the odd-numbered gate electrodes G1 and G3 of the high-breakdown-voltage transistors are disposed commonly with the odd-numbered gate electrodes G1 and G3 of the high-breakdown-voltage transistors in the neighboring unit high-breakdown-voltage transistors in the bit line direction. Thereby, the odd-numbered gate electrodes G1 and G3 can be shared. Further, the even-numbered gate electrodes G2 and G4 of the high-breakdown-voltage transistors are disposed commonly with the even-numbered gate electrodes G2 and G4 of the high-breakdown-voltage transistors in the neighboring unit high-breakdown-voltage transistors in the word line direction. Thereby, the even-numbered gate electrodes G2 and G4 can be shared.

Moreover, in each of the unit high-breakdown-voltage transistors 22-A to 22-Z, four bit lines (e.g. BL1 to BL4) are gathered in each unit high-breakdown-voltage transistor. Compared to the case of gathering, e.g. two bit lines, the number of bit lines gathered can be increased. Accordingly, the area of occupation of the unit high-breakdown-voltage transistor 22 can be reduced. In the present embodiment, as described above, the number of bit lines BL which are gathered can be set at a multiple of 4 (BL1 to BL4, ... ).

With the above-described layout, the integration density of unit high-breakdown-voltage transistors 22 can be increased, and microfabrication can advantageously be achieved.

(2) A punch-through leak current can be prevented from occurring.

As described above, at the time of the odd/even write operation, the voltage that is applied between the drains D3 of the neighboring unit high-breakdown-voltage transistors 22-A and 22-B, for instance, is a potential difference (e.g. about 3V) of about 0V to Vdd at maximum.

Therefore, the voltage that is applied between the neighboring unit high-breakdown-voltage transistors can be decreased, compared to, for example, the erase voltage Vera that is a high voltage of about 20V, and the occurrence of a punch-through leak current can be prevented.

Moreover, the field width (i.e. the width of the device isolation film 26) in the bit line direction can be decreased to such a size as to be capable of preventing the occurrence of punch-through at the potential difference of about 0V to Vdd. Accordingly, the field width can advantageously be reduced.

(3) A potential difference between the diffusion layers of the drains D1 and drains D3 can be prevented at the time of the precharge operation, and a field inversion leak current can be prevented.

As described above, the relationship in bias at the time of the precharge operation is as shown in FIG. 7. For example, as indicated by the broken line 29 in FIG. 7, the power supply voltage Vdd is applied to the drains D1 of the unit high-breakdown-voltage transistors 22-B and 22-D, and 0V is applied to the gate electrode G2 that is provided between the devices. Thus, a potential difference is prevented from occurring between the diffusion layers of the respective drains D1, and no leak current flows. Therefore, a field inversion leak current is prevented.

Further, as indicated by the broken line 27 in FIG. 7, 0V is applied to the drains D3 of the unit high-breakdown-voltage transistors 22-B and 22-C, and to the gate electrode G2 that is provided between the devices. Thus, a potential difference is prevented from occurring between the diffusion layers of the respective drains D3, and no leak current flows. Therefore, a field inversion leak current is prevented.

SECOND EMBODIMENT

An Example of a High-Breakdown-Voltage Transistor in which the Active Area AA has a Mesh-Like Structure, and Cut-Off Gates are Further Provided Next, a semiconductor device according to a second embodiment of the invention is described with reference to FIG. 8. This embodiment relates to an example in which the active area AA has a mesh-like structure, and cut-off gates are further provided. A detailed description of the parts common to those in the first embodiment is omitted here.

Figure 8:
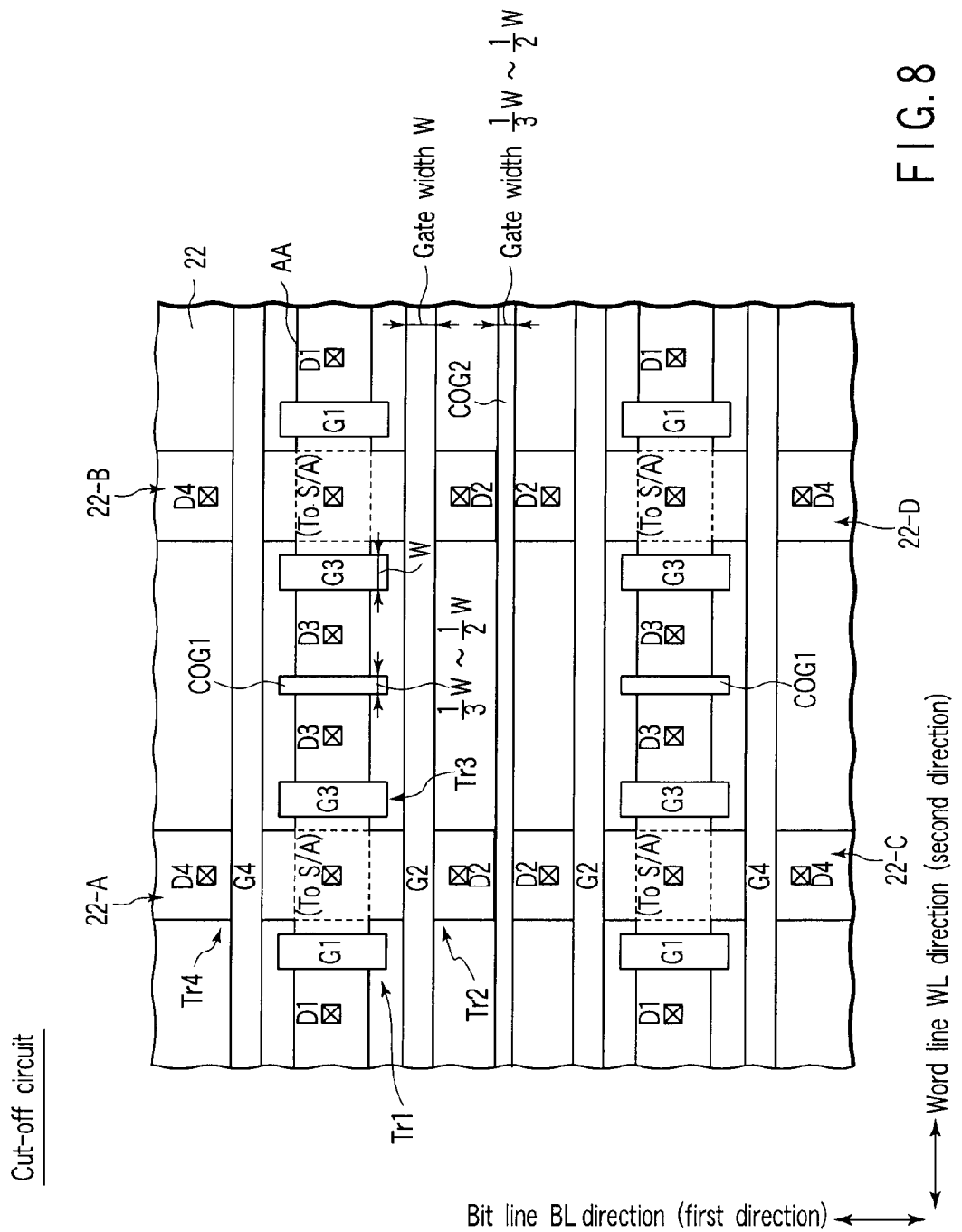
FIG. 8 is a circuit diagram showing a cut-off circuit according to a second embodiment of the invention.

As shown in FIG. 8, the semiconductor device according to the second embodiment differs from that of the first embodiment with respect to the following respects.

First, the second embodiment differs from the first embodiment in that the plan-view layout of the active areas AA of the unit high-breakdown-voltage transistors 22-A to 22-Z has such a mesh-like shape that the active areas AA extend in the bit line direction and word line direction and are shared by the neighboring unit high-breakdown-voltage transistors.

Second, the second embodiment differs from the first embodiment in that cut-off gates COG1 and COG2 are provided between the unit high-breakdown-voltage transistors 22-A to 22-Z which neighbor in the bit line direction and word line direction.

The gate width of the cut-off gate COG1 in the word line direction is, e.g. about ⅓W to ½W, when the gate width of the gate electrode G3 in the word line direction is W, and the gate width of the cut-off gate COG1 can be reduced. In addition, the gate width of the cut-off gate COG2 in the bit line direction is, e.g. about ⅓W to ½W, when the gate width of the gate electrode G2 in the bit line direction is W, and the gate width of the cut-off gate COG2 can be reduced.

<Relationship in Bias>

Figure 10:
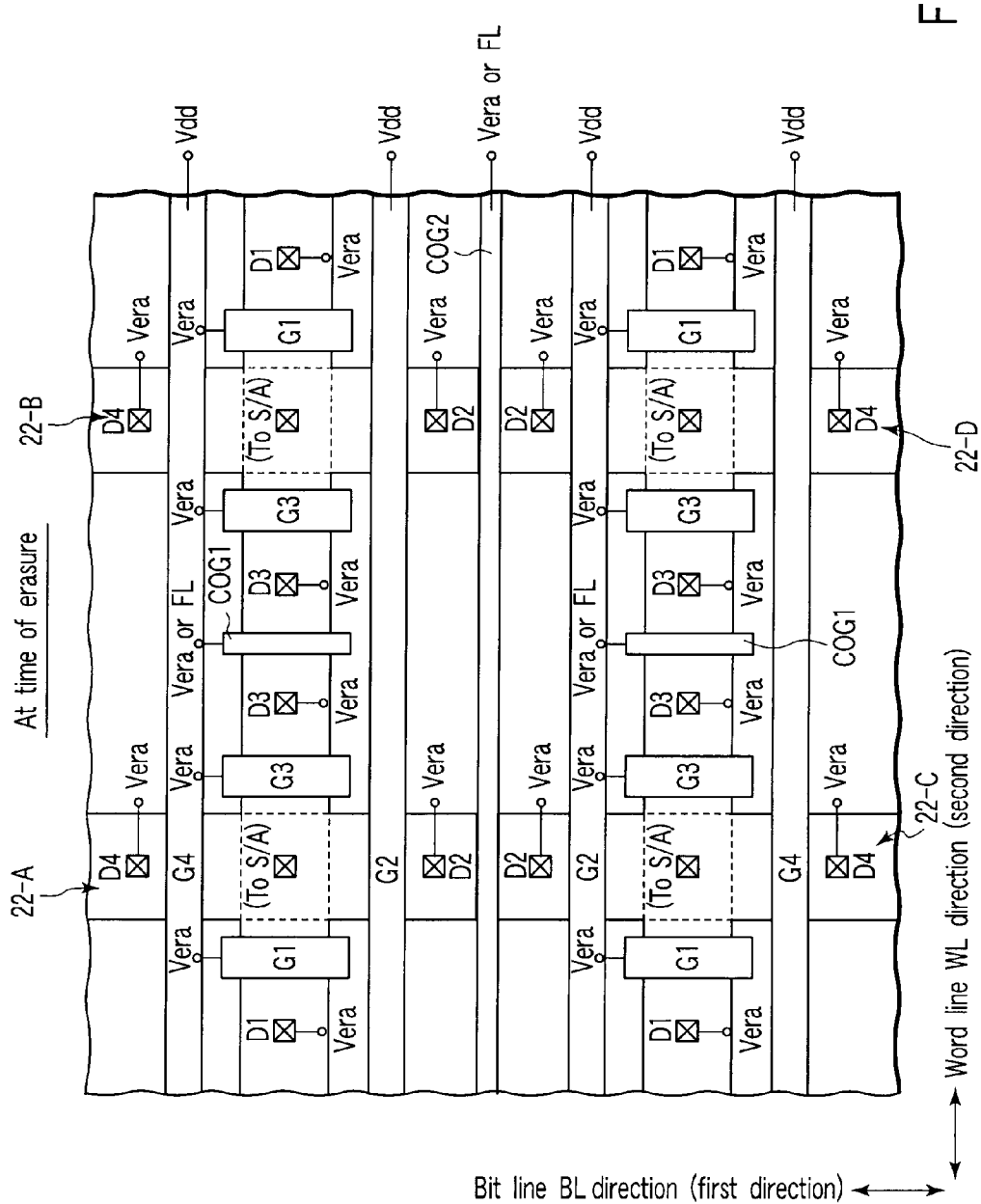
FIG. 10 is a plan view showing a layout at a time of an erase operation of the cut-off circuit according to the second embodiment.

Next, referring to FIG. 9 and FIG. 10, a description is given of the relationship in bias in the cut-off circuit 19 at the time of a write operation, an erase operation and a read operation in the semiconductor device according to the present embodiment. The description is based on FIG. 9.

As is shown in FIG. 9, the relationship in bias is the same as that in the first embodiment, except that 0V is applied to the cut-off gates COG1 and COG2 at the time of the odd/even write operation, precharge operation and read operation, and an erase voltage Vera or a floating voltage FL is applied to the cut-off gates COG1 and COG2 at the time of the erase operation.

(Erase Operation)

Next, referring to FIG. 10, the relationship in bias at the time of the erase operation is described.

To begin with, as shown in FIG. 10, an erase voltage Vera is applied to all the bit lines BL1, . . . , BLm, and an erase voltage Vera is also applied to the drains D1 to D4. At this time, simultaneously, a power supply voltage Vdd is applied to the gates G1 to G4, and a power supply voltage Vdd is also applied to the source S that is connected to the sense amplifier S/A.

Further, at this time, an erase voltage Vera (or a floating voltage FL) is applied to the cut-off gates COG1 and COG2, and the voltage of the substrate 21 is raised.

As has been described above, according to the semiconductor device of this embodiment, the same advantageous effects as the above-described (1) to (3) can be obtained. Further according to this embodiment, the following advantageous effect (4) can be obtained.

(4) Dielectric breakdown can be prevented.

As has been described above, the unit high-breakdown-voltage transistors 22-A to 22-Z include the cut-off gates COG1 and COG2 which are provided between the unit high-breakdown-voltage transistors 22-A to 22-Z which neighbor in the bit line direction and word line direction. Further, at the time of the erase operation, the erase voltage Vera (or floating voltage FL) is applied to the cut-off gates COG1 and COG2, and the voltage of the substrate 21 can be raised.

Thus, advantageously, it is possible to prevent dielectric breakdown, by which the device isolation structure is broken when the erase voltage Vera that is a high voltage, which is applied to the drains D1 to D4, exceeds the surface breakdown voltage of the substrate 21.

In the first and second embodiments, the bit line BL direction and word line WL direction are exemplified as directions. However, these directions are mere examples, and other directions may be set for arrangement, as needed.

In the embodiments, the drain contacts DC1 to DC4 and source line contact SC are linearly arranged in the bit line BL direction. However, the arrangement of the drain contacts DC1 to DC4 and source line contact SC is not limited to this example. For example, the drain contacts DC1 to DC4 and source line contact SC may be arranged in a staggered fashion in the bit line direction. In the case of this arrangement, advantageously, it becomes possible to easily connect the overlying wiring layer that is electrically connected to the drain contacts DC1 to DC4 and source line contact SC.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising a unit high-breakdown-voltage transistor including first to fourth high-breakdown-voltage transistors which are commonly connected at one end of each of current paths thereof, the first high-breakdown-voltage transistor is connected to a first write line at the other end of the current path thereof, and includes a first gate which is disposed in a first direction;

the second high-breakdown-voltage transistor is connected to a second write line at the other end of the current path thereof, and includes a second gate which is disposed in a second direction crossing the first direction;

the third high-breakdown-voltage transistor is connected to a third write line at the other end of the current path thereof, and includes a third gate which is disposed in the first direction; and the fourth high-breakdown-voltage transistor is connected to a fourth write line at the other end of the current path thereof, and includes a fourth gate which is disposed in the second direction.

2. The device according to claim 1, wherein a plan-view layout of an active area of the unit high-breakdown-voltage transistor has a cross shape in which said one ends of the current paths commonly connected are disposed at a center and said other ends of the current paths of the first to fourth high-breakdown-voltage transistors extend along the first direction and the second direction.

3. The device according to claim 1, further comprising a plurality of said unit high-breakdown-voltage transistors which are arranged in a staggered fashion,
wherein the first and third gates are commonly connected between the unit high-breakdown-voltage transistors which neighbor in the first direction, and
the second and fourth gates are commonly connected between the unit high-breakdown-voltage transistors which neighbor in the second direction.

4. The device according to claim 3, wherein said other ends of the current paths connected to the first write line are provided in a manner to sandwich the second gate electrode in the first direction and, at a time of a precharge operation, an identical potential is applied to said other ends of the current paths of the first high-breakdown-voltage transistors of different said unit high-breakdown-voltage transistors.

5. The device according to claim 3, wherein at a time of an erase operation, an identical potential is applied to said other ends of the current paths of the first to fourth high-breakdown-voltage transistors.

6. The device according to claim 1, wherein at a time of an odd write operation, a first power supply voltage is applied to said one end of each of the current paths of the first to fourth high-breakdown-voltage transistors, the second or third power supply voltage is applied to the first and third gates, the third power supply voltage is applied to the second and fourth gates, and the third power supply voltage is higher than the first power supply voltage by threshold voltage of each of the first to fourth high-breakdown-voltage transistors.

7. The device according to claim 1, wherein at a time of an even write operation, a first power supply voltage is applied to said one end of each of the current paths of the first to fourth high-breakdown-voltage transistors, the second power supply voltage is applied to the first and third gates, the second or third power supply voltage is applied to the second and fourth gates, and the second power supply voltage is higher than the first power supply voltage by threshold voltage of each of the first to fourth high-breakdown-voltage transistors.

8. The device according to claim 1, wherein at a time of an erase operation, an erase voltage is applied to said other ends of the current paths of the first to fourth high-breakdown-voltage transistors, a first power supply voltage is applied to the first to fourth gates, and the first power supply voltage is applied to said one end of each of the current paths of the first to fourth high-breakdown-voltage transistors.

9. The device according to claim 1, wherein at a time of a read operation, a first power supply voltage is applied to the first gate that is selected, thereby turning on the first high-breakdown-voltage transistor, and a second power supply voltage is applied to the second to fourth gates that are not selected, thereby turning off the second to fourth high-breakdown-voltage transistors.

10. The device according to claim 1, further comprising a plurality of said unit high-breakdown-voltage transistors each including the first to fourth high-breakdown-voltage transistors, wherein a plan-view layout of active areas of the plurality of unit high-breakdown-voltage transistors has such a mesh-like shape that said other ends of the current paths of the first to fourth high-breakdown-voltage transistors extend in the first and second directions and are shared by neighboring said unit high-breakdown-voltage transistors.

11. The device according to claim 10, further comprising a first cut-off gate provided between the unit high-breakdown-voltage transistors which neighbor in the first direction.

12. The device according to claim 11, further comprising a second cut-off gate provided between the unit high-breakdown-voltage transistors which neighbor in the second direction.

13. The device according to claim 12, wherein at a time of an odd write operation, the first power supply voltage is applied to said one end of each of the current paths of the first to fourth high-breakdown-voltage transistors, the second or third power supply voltage is applied to the first and third gates, the third power supply voltage is applied to the second and fourth gates, the second power supply voltage is applied to the first and second cut-off gates, and the third power supply voltage is higher than the first power supply voltage by threshold voltage of each of the first to fourth high-breakdown-voltage transistors.

14. The device according to claim 12, wherein at a time of an even write operation, the first power supply voltage is applied to said one end of each of the current paths of the first to fourth high-breakdown-voltage transistors, the second power supply voltage is applied to the first and third gates, the second or third power supply voltage is applied to the second and fourth gates, the second power supply voltage is applied to the first and second cut-off gates, and the second power supply voltage is higher than the first power supply voltage by threshold voltage of each of the first to fourth high-breakdown-voltage transistors.

15. The device according to claim 12, wherein at a time of an erase operation, an erase voltage is applied to said other ends of the current paths of the first to fourth high-breakdown-voltage transistors, a first power supply voltage is applied to the first to fourth gates, the first power supply voltage is applied to said one end of each of the current paths of the first to fourth high-breakdown-voltage transistors, and one of the first power supply voltage and a floating voltage is applied to the first and second cut-off gates.

16. The device according to claim 12, wherein at a time of a precharge operation, the first power supply voltage is applied to said one end of each of the current paths of the first to fourth high-breakdown-voltage transistors, a second power supply voltage is applied to the first gate that is selected, a third power supply voltage is applied to the second to fourth gates that are not selected, the second power supply voltage is applied to the first and second cut-off gates, and the second power supply voltage is higher than the first power supply voltage by threshold voltage of each of the first to fourth high-breakdown-voltage transistors.

17. The device according to claim 12, wherein at a time of a read operation, a first power supply voltage is applied to the first gate that is selected, thereby turning on the first high-breakdown-voltage transistor, the second power supply voltage is applied to the second to fourth gates that are not selected, thereby turning off the second to fourth high-breakdown-voltage transistors, and the second power supply voltage is applied to the first and second cut-off gates.

18. The device according to claim 1, further comprising a sense amplifier which is electrically connected to said one end of each of the current paths of the first to fourth high-breakdown-voltage transistors.

19. The device according to claim 1, further comprising a memory cell array including a plurality of memory cells which are disposed in a matrix at intersections between a plurality of bit lines and a plurality of word lines, wherein said other end of the current path of each of the first to fourth high-breakdown-voltage transistors is electrically connected to one end of an associated one of the plurality of bit lines.

20. The device according to claim 19, further comprising:

a row decoder which are electrically connected to the plurality of word lines;

a column decoder which is electrically connected to the other end of each of the plurality of bit lines;

a voltage generating circuit which generates a predetermined voltage; and a control circuit which controls the voltage generating circuit.

* * * * *